United States Patent

Sato et al.

[11] Patent Number: 5,839,187
[45] Date of Patent: Nov. 24, 1998

[54] APPARATUS AND METHOD FOR MOUNTING A CHIP

[75] Inventors: Seiichi Sato, Chikushino; Kenichi Otake, Fukuoka, both of Japan

[73] Assignee: Matsushita Electric Industrial Co., Ltd., Osaka, Japan

[21] Appl. No.: 690,077

[22] Filed: Jul. 31, 1996

[30] Foreign Application Priority Data

Aug. 24, 1995 [JP] Japan .................................. 7-215876

[51] Int. Cl.$^6$ .................................................. B23P 21/00
[52] U.S. Cl. .............................. 29/743; 29/759; 29/809; 414/744.7
[58] Field of Search .......................... 414/744.7; 901/17; 29/740, 743, 759, 809

[56] References Cited

U.S. PATENT DOCUMENTS

| | | | |
|---|---|---|---|
| 4,372,802 | 2/1983 | Harigane et al. | 29/743 X |
| 4,556,362 | 12/1985 | Bahnck et al. | 414/935 X |
| 5,305,518 | 4/1994 | Okumoto | 29/743 X |
| 5,692,293 | 12/1997 | Igarashi et al. | 29/743 X |

FOREIGN PATENT DOCUMENTS

2-36600   2/1990   Japan .

*Primary Examiner*—Janice L. Krizek
*Attorney, Agent, or Firm*—Stevens, Davis, Miller & Mosher, L.L.P.

[57] ABSTRACT

An apparatus and a method for mounting a chip make it possible to accomplish quick chip mounting and also to mount multiple different chips on substrates. Three heads are provided around a center rod of a head assembly; they horizontally rotate around the center rod. When the heads rotate horizontally, they are turned 180 degrees vertically by a first bevel gear and a second bevel gear. A nozzle of one of the heads picks up a flip chip from a wafer sheet and rotates 180 degrees horizontally to transfer the flip chip to a transferring head, during which it vertically inverts 180 degrees so as to vertically invert the flip chip. The transferring head receives the flip chip from the head and mounts it on a substrate. According to the type of chips to be mounted, the heads and the transferring head are equipped with nozzles best suited for the type of chips.

8 Claims, 7 Drawing Sheets

APPARATUS AND METHOD FOR MOUNTING A CHIP

BACKGROUND OF THE INVENTION

1. Field of the Invention

The present invention relates to an apparatus and a method for vertically reversing a chip, which has been provided on a chip supplying portion such as a wafer or tray, and mounting it on a substrate.

2. Description of the Related Art

There has been known a chip mounting apparatus disclosed in Japanese Patent Laid-Open No. 2-56945; it is adapted to vertically invert a chip such as a flip chip provided on a chip supplying portion such as a wafer or tray and mount it on a substrate. This type of chip mounting apparatus is designed to pick up a flip chip by vacuum suction, attach it to a suction member provided on the distal end of an arm, and vertically reverse the arm 180 degrees, thereby vertically reversing the flip chip before handing it to a transferring head which mounts it on a substrate.

Such a conventional chip mounting apparatus described above, however, has been designed so that the arm repeatedly rotates 180 degrees vertically to pick up a wafer chip and hand it to the transferring head; therefore, it has been difficult to mount chips on substrate at high speed.

There has also been a problem in that some types of substrates require many different types of chips be mounted, whereas the conventional chip mounting apparatus is equipped with only one nozzle and not capable of mounting multiple types of chips at a time.

SUMMARY OF THE INVENTION

Accordingly, it is an object of the present invention to provide a chip mounting apparatus and a chip mounting method which enable high-speed chip mounting and also permit mounting of multiple types of chips at a time.

To this end, according to the present invention, there is provided a chip mounting apparatus which comprises a chip supplying portion, a substrate positioning section, a head assembly provided with a plurality of nozzles which pick up chips from the chip supply portion and rotate horizontally and vertically, and a transferring head which picks up the chips, which have been vertically inverted by the vertical rotation, from the top ends of the nozzles, and mount the chips on a substrate which has been positioned in the positioning section.

Preferably, a camera is provided to observe and inspect a chip to be picked up next by observing the chip from above it under the following condition: one of the plurality of nozzles has been horizontally rotated to a position where it hands a chip over to the transferring head and the next nozzle is in a position where it has been displaced from the pickup position where a chip is picked up from the chip supply portion or member.

Further preferably, the chip supply portion is provided with a plurality of types of chips having different dimensions while the head assembly is equipped with a plurality of types of nozzles adapted for different sizes of chips, so that many different types of chips may be mounted on a substrate which has been positioned in the positioning section.

Further preferably, a nozzle magazine provided with a plurality of types of nozzles is provided to enable the transferring head to exchange nozzles with the nozzle magazine.

There is also provided a chip mounting method comprising: a step wherein a nozzle of the head assembly picks up a chip from a chip supply portion by vacuum suction; a step wherein the nozzle rotates horizontally and vertically to move the chip, which has been picked up, to a position where the chip is handed over to the transferring head, and also inverts it vertically; and a step wherein the transferring head picks up the chip and mounts it on a substrate which has been positioned in the positioning section.

With this arrangement, a plurality of nozzles may be used to vertically invert chips and quickly mount them on a substrate. Moreover, many different types of chips, rather than a single type of chips, may be mounted on the substrate at high speed.

DESCRIPTION OF THE PREFERRED EMBODIMENTS

Figure 1:
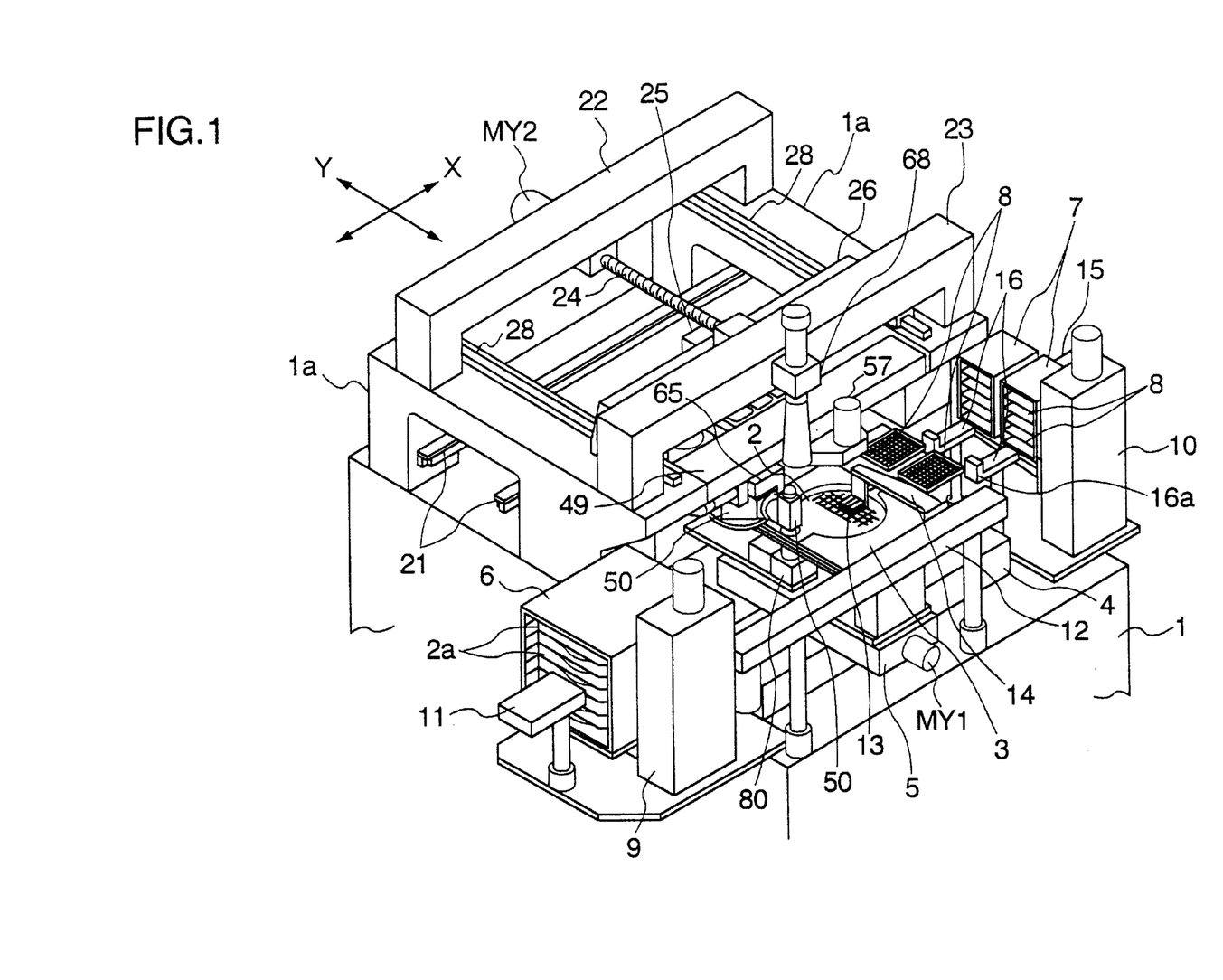
FIG. 1 is a front perspective view showing a chip mounting apparatus of an embodiment in accordance with the present invention.
Figure 2:
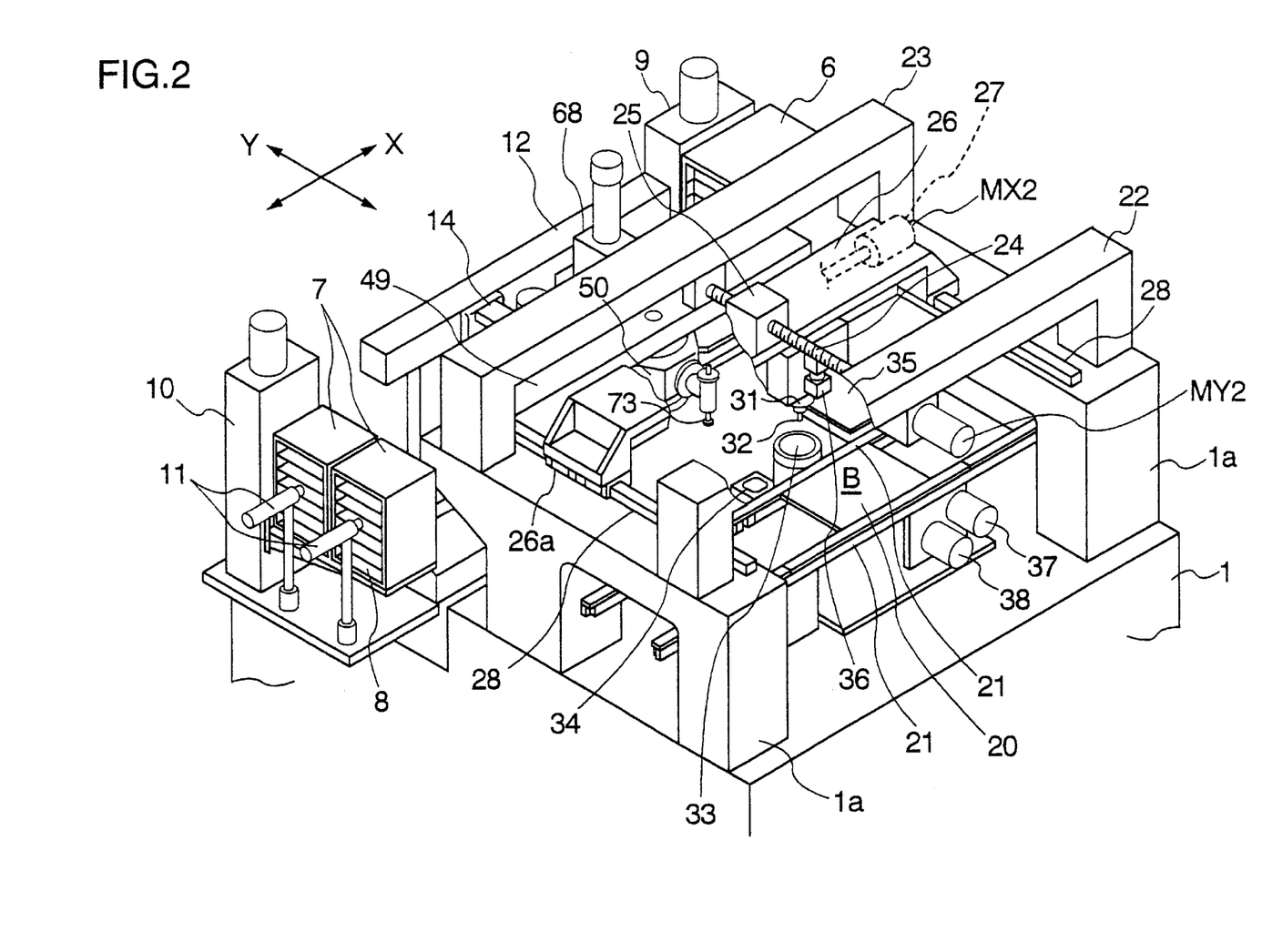
FIG. 2 is a rear perspective view showing the chip mounting apparatus of the embodiment in accordance with the present invention.
Figure 3:
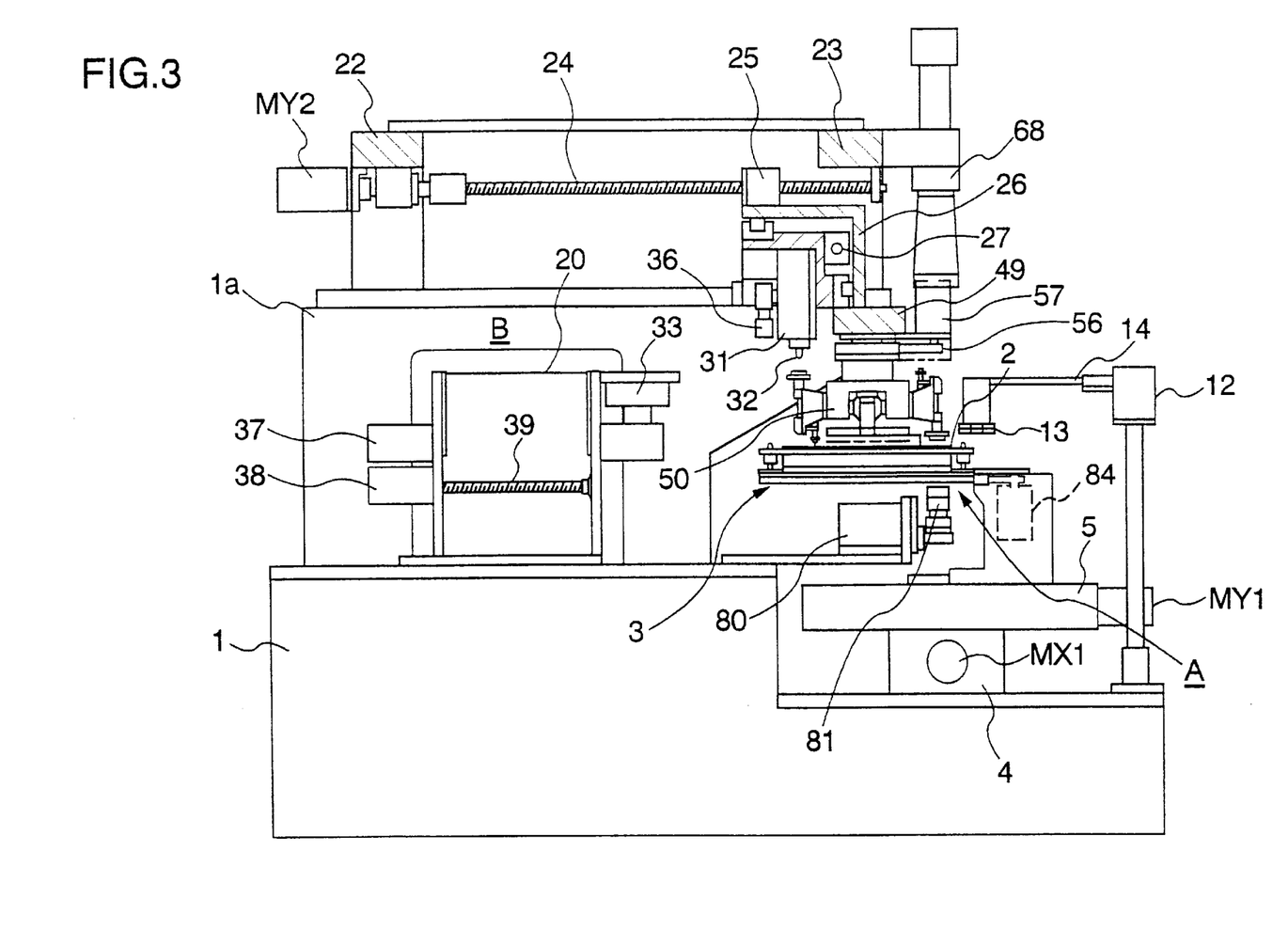
FIG. 3 is a side view showing the chip mounting apparatus of the embodiment in accordance with the present invention.
Figure 4:
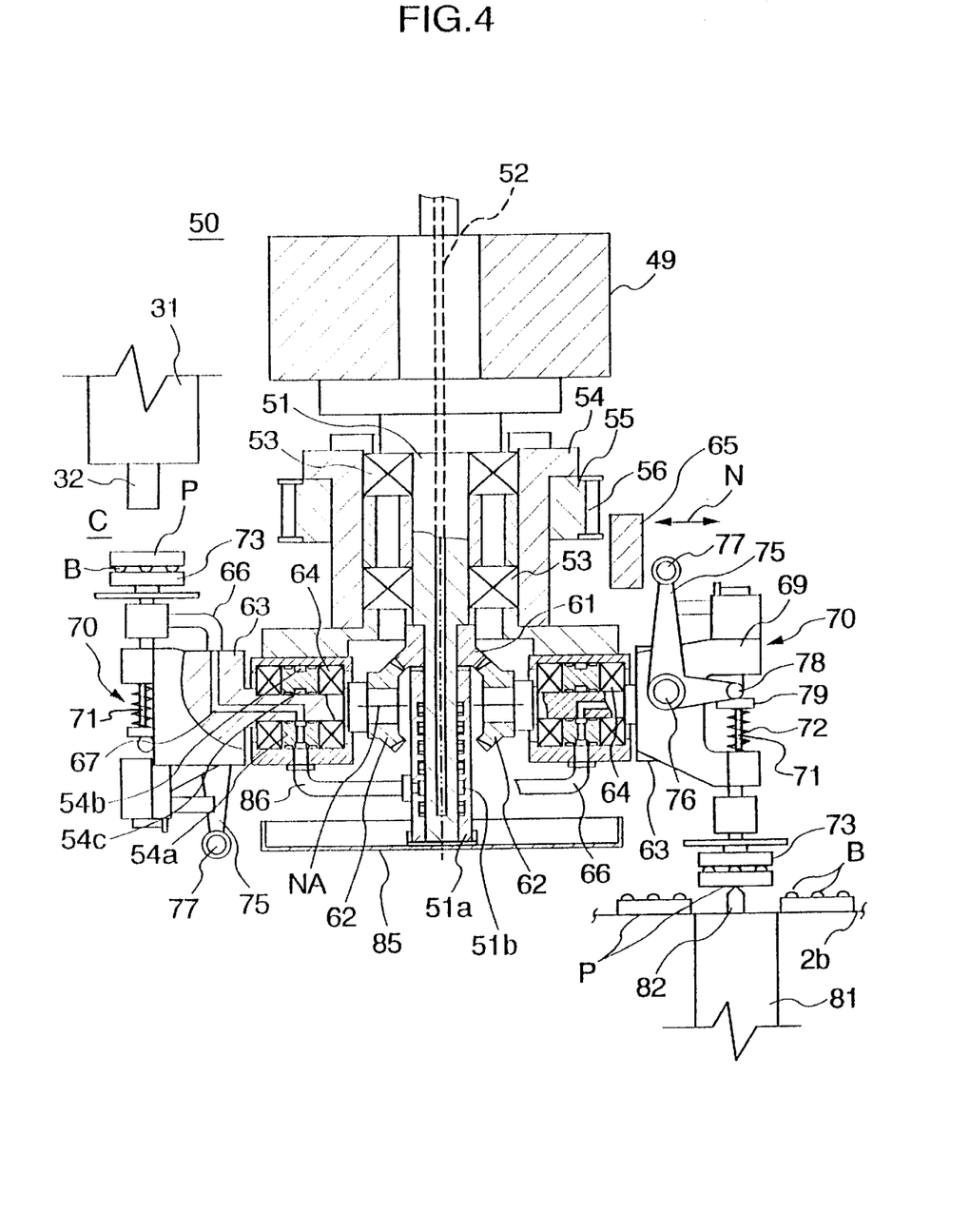
FIG. 4 is a sectional view showing a head assembly of the chip mounting apparatus of the embodiment in accordance with the present invention.
Figure 5:
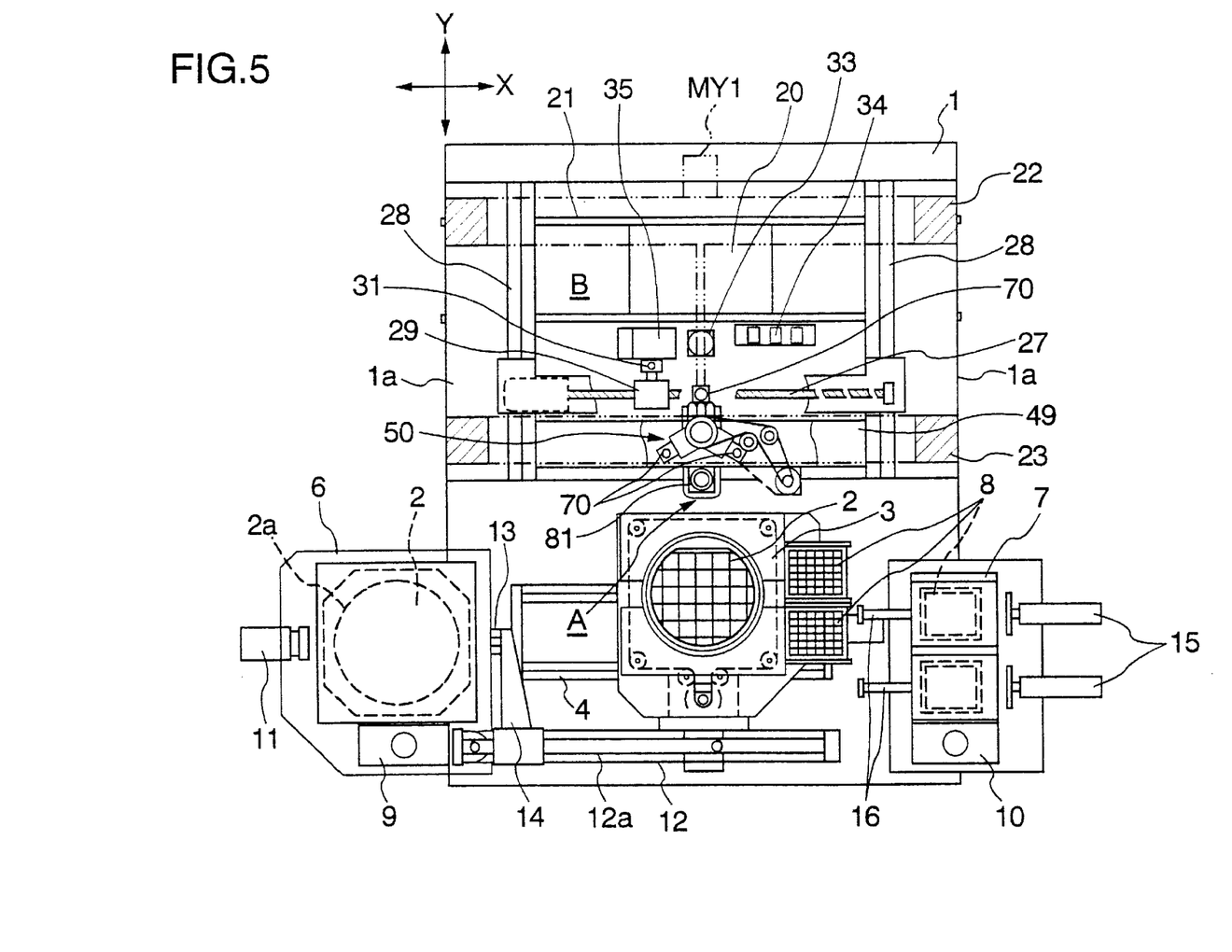
FIG. 5 is a top plan view showing the chip mounting apparatus of the embodiment in accordance with the present invention.
Figure 6:
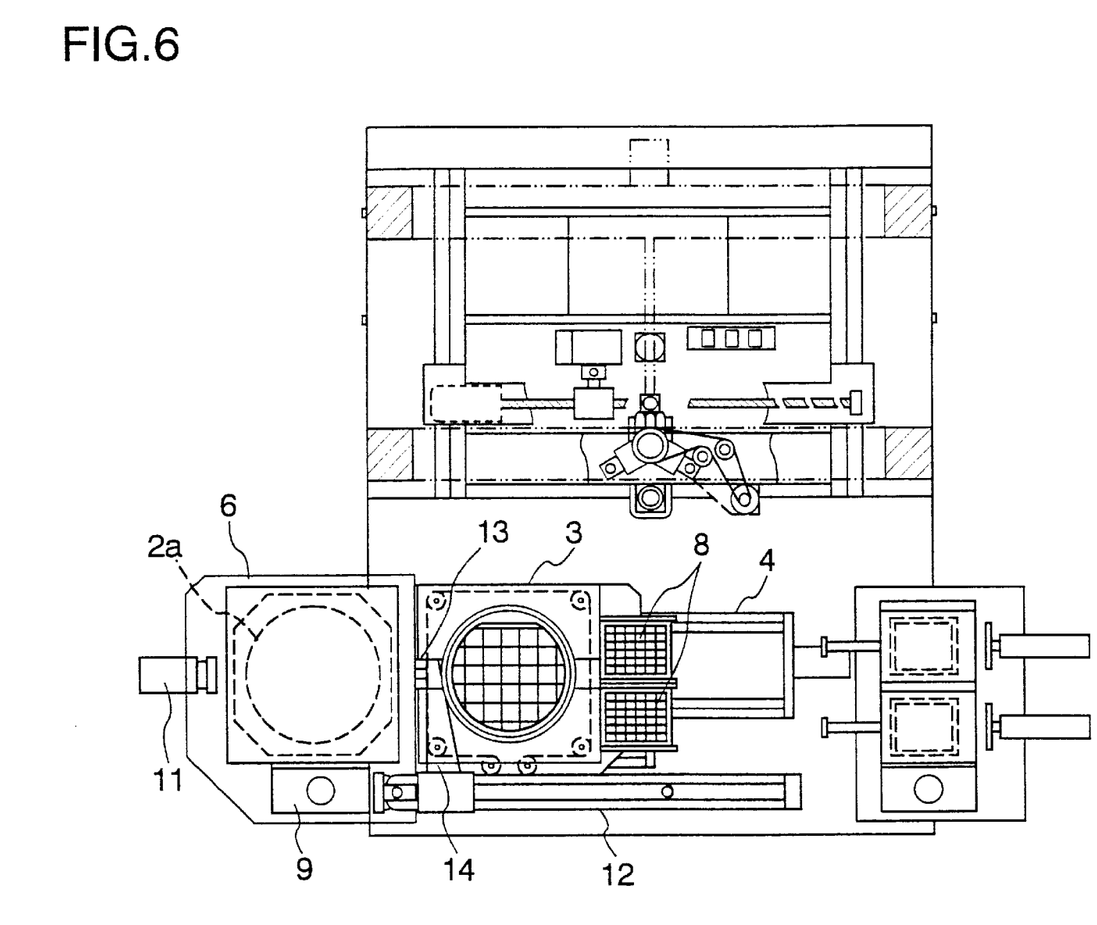
FIG. 6 is a top plan view showing the chip mounting apparatus of the embodiment in accordance with the present invention.
Figure 7:
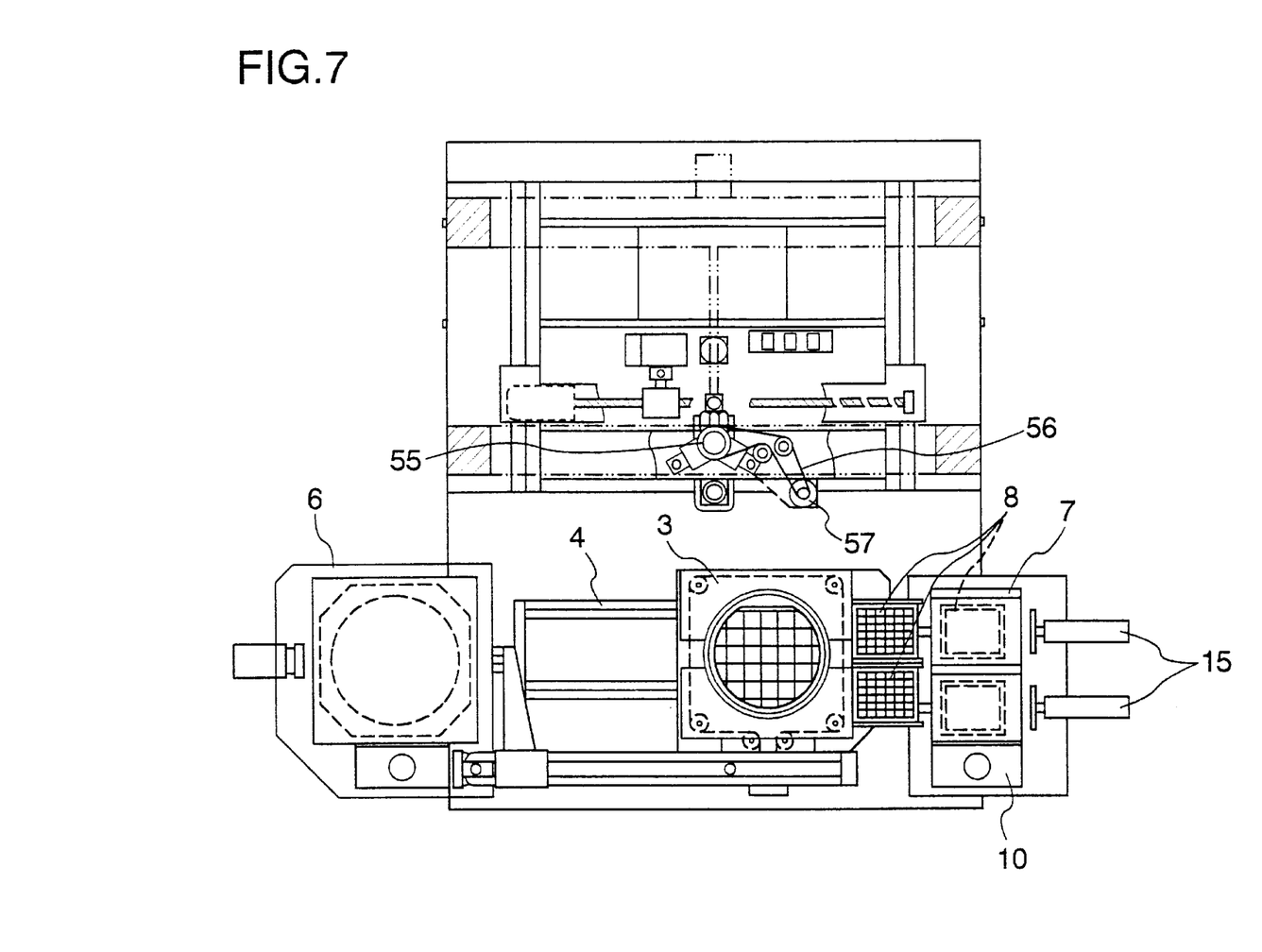
FIG. 7 is a top plan view showing the chip mounting apparatus of the embodiment in accordance with the present invention.

An embodiment of the present invention will now be described with reference to the accompanying drawings. FIG. 1 is a front perspective view showing a chip mounting apparatus; FIG. 2 is a rear perspective view showing the same; FIG. 3 is a side view showing the same; FIG. 4 is a sectional view showing a head assembly of the same; FIG. 5, FIG. 6, and FIG. 7 are top plan views of the same.

In FIG. 1, provided on a base 1 are a wafer 2 retained on a chip supply table 3 which is mounted on an X table 4 and a Y table 5 which are movable tables installed on front top surface of the base 1. When the X table 4 and the Y table 5 are operated by an X motor MX1 shown in FIG. 3 and a Y motor MY1, the chip supply table 3 moves horizontally in an X direction or a Y direction. The chip supply table 3 retains two trays 8, which hold flip chips, and also the wafer 2.

The wafer 2 shown in FIG. 1 is located in a pickup station where a chip is picked up by a nozzle, which will be discussed later; installed on both sides thereof are a first magazine 6 and two second magazines 7. The first magazine 6 has wafer holders 2a in tiers provided with wafer sheets for holding the wafer 2. Each of the two second magazines 7 has trays 8 in tiers, the trays 8 holding chips. The type of the chips of the wafer 2 is different from that of the chips of the trays 8 of the two second magazines 7. Provided on the sides of the first magazine 6 and the second magazines 7 are elevators 9 and 10, respectively. The elevators 9 and 10 are respectively operated to move the first magazine 6 and the second magazines 7 up and down.

Provided at the rear of the first magazine 6 is a pusher 11. A lengthy carrier 12 is installed in the X direction above the front edge of the base 1. An arm 14, which has a chuck hook 13 at its distal end, is connected to the carrier 12 (see also FIG. 3). The arm 14 is connected to a rotating belt 12a (FIG. 5) incorporated in the carrier 12; when the rotary belt 12a is driven by a motor, which is not shown, it moves in the X direction along the carrier 12. In FIG. 5, pushers 15 are provided also at the rear of the second magazines 7. Provided at the front of the second magazines 7 are hook-type collecting arms 16 (FIG. 1) which jut out to the front.

FIG. 5 through FIG. 7 illustrate the operation of exchange between the wafer holders 2a and the trays 8. FIG. 5 shows the wafer 2 when it is positioned in front of a pickup station A at the center of the base 1. From this state, the wafer 2 is moved to be positioned right above a pepper pot 81 of a die ejector provided on the pickup station A, then a chip provided on the wafer 2 is picked up by a nozzle 73, which will be described later, of a head 70 and mounted on a substrate 20 which has been positioned on a mounting station B. When the wafer 2 has run out of chips or when the chips of the wafer 2 are replaced by a different type of chips, the wafer holders 2a are installed to or removed from the first magazine 6. More specifically, as illustrated in FIG. 6, the X table 4 is driven to bring the chip supply table 3 on the Y table 5 close to the first magazine 6 so as to set the wafer holder 2a, which is retained on the chip supply table 3, in the first magazine 6. Then, the elevator 9 is driven to move the desired wafer holder 2a in the first magazine 6 to make it flush with the pusher 11 and the chuck hook 13. The pusher 11 pushes the wafer holder 2a in the first magazine 6 toward the chuck hook 13 so that the chuck hook 13 chucks the wafer holder 2a. The chuck hook 13 is then moved to the right to set the wafer holder 2a on the chip supply table 3. Subsequently, the wafer holder 2a is released from the chuck hook 13 and the X table 4 is driven to move another wafer holder 2a to the pickup station A shown in FIG. 5.

To change the trays 8, the trays 8 on the chip supply table 3 are moved to the second magazines 7 as illustrated in FIG. 7. The trays 8 are then collected into the second magazines 7 by moving the collecting arms 16 up or down or in the X direction; the new trays 8 in the second magazines 7 are pushed out onto the Y table 5 by the pushers 15. In this case also, the elevator 10 is driven to move the second magazines 7 up or down. Thus, the wafer holders 2a and the trays 8 may be replaced quickly by disposing the first magazine 6 and the second magazines 7 on the right and left of the pickup station and by disposing the carrier 12, the pushers 11 and 15, the arm 14, the collecting arms 16, etc.

In FIG. 2, two guide rails 21, which serve to position the substrate 20, are provided above and at the rear side of the base 1. The substrate 20 is carried in the X direction along the guide rails 21 and it is also clamped by the guide rails 21 so as to be positioned on the chip mounting station B. A first frame 22 and a second frame 23 are mounted on a pair of Y-axis frames 1a which are provided on both sides on the base 1. A Y screw 24 is provided between the first frame 22 and the second frame 23. Reference numeral MY2 denotes a motor for rotating the Y screw 24 with which a nut 25 is threadedly engaged. Connected to the bottom surface of the nut 25 is a frame 26 which extends in the X direction. The frame 26 includes an X screw 27 which is driven and rotated by an X motor MX2. Sliders 26a on both ends of the frame 26 are slidably mounted on guide rails 28 in the Y direction which are fixed to the Y-axis frames 1a. A nut 29 shown in FIG. 5 is threadedly engaged with the X screw 27; a transferring head 31, which has a nozzle 32 for vacuum-suctioning a chip, is connected to the nut 29. Thus, when the X motor MX2 or the Y motor MY2 runs, the transferring head 31 moves in the X direction or the Y direction.

In FIG. 2 and FIG. 5, there are provided a chip recognizing camera 33, a nozzle magazine 34, and a flux applicator 35 under the moving path of the transferring head 31. The transferring head 31 moves to above the camera 33; the chip, which has been attached to the bottom end of the nozzle 32 by vacuum suction, is observed through the camera 33 mainly to check the position of the chip. To change the nozzle to handle a different type of chips, the transferring head 31 is moved to above the nozzle magazine 34 to replace the nozzle. The method which has been disclosed in, for example, Japanese Patent Laid-Open No. 2-36600 may be applied to replace the nozzle. In the case of a flip chip which has a solder bump, the transferring head 31 moves to above the flux applicator 35 to apply flux to the solder bump which juts out from the bottom of the flip chip. A camera 36 for recognizing a substrate is integrally provided on the side surface of the transferring head 31 as shown in FIG. 3. The camera 36 moves to above the substrate 20 to check an identification mark and the characteristic sections of the substrate 20, thereby detecting the position of the substrate 20. Reference numeral 37 denotes a motor for driving a substrate carrying conveyor built in the guide rails 21, reference numeral 38 denotes a motor for adjusting the interval between the guide rails 21, and reference numeral 39 denotes a ball screw for adjusting the interval. The distance between the guide rails 21 is adjusted according to the type of the substrate 20 (see also FIG. 3).

In FIG. 3, both ends of a horizontal frame 49, which is provided below the second frame 23, are connected to the Y-axis frames 1a, the horizontal frame 49 being equipped with a head assembly 50. Referring now to FIG. 4, the configuration of the head assembly 50 will be described in detail. A center rod 51, the top end of which is fixed to the horizontal frame 49, includes the same number of suction holes 52 as that of the heads 70 although only one suction hole 52 is shown in FIG. 4. A rotary cylinder 54 is mounted on the top of the center rod 51 via a bearing 53. The rotary cylinder 54 has a pulley 55 around which a timing belt 56 is wound. As shown in FIG. 3, the timing belt 56 is wound around the rotary shaft of a motor 57 (see also FIG. 7); therefore, as the motor 57 runs, the rotary cylinder 54 horizontally revolves around the axial center thereof.

In FIG. 4, a first bevel gear 61 is mounted on the bottom of the center rod 51; a second bevel gear 62 is engaged with the first bevel gear 61 at a gear ratio of 1:1. A rotary block 63 is attached to the exterior of the second bevel gear 62. The aforesaid rotary cylinder 54 and the rotary block 63 are rotatably connected around a horizontal axis NA via a bearing 64. When the motor 57 is driven to cause the rotary cylinder 54 to revolve horizontally, the rotary block 63 coupled to the rotary cylinder 54 via the bearing 64 also revolves horizontally around the axial center line of the center rod 51. At this time, the second bevel gear 62 horizontally rotates around the first bevel gear 61 which does not rotate since it is fixed to the center rod 51. Thus, the second bevel gear 62 vertically rotates 180 degrees around the horizontal axis NA. In other words, the rotary block 63 rotates horizontally and vertically at the same time as the motor 57 is driven.

A U-shaped bracket 69 is attached to the outside of the rotary block 63, the head 70 being attached to the bracket 69. The head 70 has a vertical nozzle shaft 71. A flip chip P is adhesively mounted on the wafer sheet 2b with a bump B facing upward. The nozzle shaft 71 is urged upward by a coil spring 72. An L-shaped lever 75 is rotatably journaled to the bracket 69 in the vertical direction by a pin 76. Rollers 77 and 78 are mounted on both ends of the lever 75; the lower roller 78 is in contact with a seat plate 79 connected to the nozzle shaft 71. A pushing member 65 is provided beside the upper roller 77 (see also FIG. 1). The pushing member 65 is driven by a driver such as a motor or a cam, which is fixed to the horizontal frame 49 and which is not shown, and it moves in a lateral direction N.

In FIG. 4, when the pushing member 65 moves to the right, the roller 77 is pushed by the pushing member 65 to cause the lever 75 to rotate clockwise. This in turn causes the roller 78 to push down the seat plate 79 while compressing the coil spring 72, thus causing the nozzle shaft 71 to move down. When the pushing member 65 moves to the left to release the roller 77, the lever 75 turns counterclockwise and the nozzle shaft 71 moves up because of the spring force of the coil spring 72. In this way, the vertical movement of the nozzle shaft 71 and the nozzle 73 allows the nozzle 73 to pick up the flip chip P from the wafer 2 by vacuum suction. Although only one suction hole 52 in the center rod 51 is shown in FIG. 4, there are actually as many such suction holes as the heads 70. An outer cylinder 51a, which is rotatably mounted on the bottom of the center rod 51, has a plurality of cylindrical grooves 51b in the inner peripheral surface thereof. The plurality of the cylindrical grooves 51b are respectively communicated to corresponding suction holes 52; they are also communicated with a tube 86 attached to the outer peripheral surface of the outer cylinder 51a. The tube 86 is connected to the bottom of the rotary cylinder 54. An annular ring member 54a is mounted between the bearings 64 of the rotary cylinder 54; the outer and inner peripheral surfaces of the ring member 54a have cylindrical grooves 54b and 54c which are communicated with each other through a hole formed in the ring member 54a. The cylindrical groove 54b is communicated with the tube 86 while the cylindrical groove 54c is communicated with a suction hole 67 formed in the rotary block 63. Connected to the suction hole 67 is a tube 66 which is communicated with the nozzle 73. Thus, the nozzle 73 is connected to a suction device, not shown, via the tube 66, the suction hole 67, the ring member 54a, the tube 86, the outer cylinder 51a, and the suction hole 52.

As shown in FIG. 5, the head assembly 50 has three heads 70 which are equidistantly arranged at 120 degrees as observed in top plan view. There is provided a chip recognizing camera 68 above the pickup station A as shown in FIG. 3. The camera 68 is used to observe the flip chip P to determine whether it is a nondefective flip chip P free of chips or other defects or to check it for a bad mark and also to detect the position of the flip chip P before the nozzle 73 picks up the flip chip P from the wafer 2.

In FIG. 3, a die ejector 80 is provided under the pickup station A. A pepper pot 81 of the die ejector 80 is placed right below the wafer 2; when the nozzle 73 picks up the flip chip P, a pin 82 juts out of the top surface of the pepper pot 81 and it breaks the wafer sheet 2b, pushing up the flip chip P from below (see also FIG. 4). In FIG. 4, a cover plate 85 attached to the bottom end of the center rod 51 serves to protect the flip chip P from being contaminated by dust falling onto the wafer 2 or the trays 8.

The operation of the entire chip mounting apparatus which has the construction described above will now be described. Firstly, the flip chip P to be picked up is moved to the pickup station A (step 1). Next, the pepper pot 81 is moved up until it comes in contact with the bottom surface of the wafer sheet 2b (step 2). The step 2 is eliminated when the flip chip is picked up from the tray. Then, the camera 68 is used to scan the flip chip P on the pickup station A to recognize the position of the flip chip; it also checks the flip chip P for a bad mark or chips (step 3). If the check result reveals that the flip chip is defective, then another flip chip P is moved to the pickup station A and the operation of the step 3 is performed again. Based on the position of the flip chip P which has been recognized, the position of the chip supply table 3 is corrected so as to accurately position the flip chip P on the pickup station A (step 4).

In the next step, the motor 57 is driven to move the head 70, which is to pick up the flip chip P, to the pickup station A (step 5). Then, the pusher 65 is moved in the direction of an arrow N shown in FIG. 4 to move the nozzle 73 down and up to pick up the flip chip P by suction. At this time, to pick up the flip chip P from the wafer sheet 2b, the pin 82 is jutted out of the pepper pot 81 (step 6). The motor 57 is then driven to horizontally turn the head 70 by 180 degrees from the pickup station A and also to vertically invert it (step 7). At the same time, the flip chip P to be picked up next is also moved to the pickup station A (step 8).

Next, the flip chip P is picked up by the nozzle 32 of the transferring head 31 (step 9). At this time, the operation of the step 3 is carried out on the flip chip P at the pickup station A. The transferring head 31 moves until it reaches above the camera 33 so that the camera recognizes the position of the flip chip P (step 10). In this step, the operations of the steps 4 and 5 are implemented. The transferring head 31 moves to the flux applicator to apply flux to the bump and mounts the bump of the flip chip P on an electrode of a substrate, the position of which has been determined by the substrate recognition implemented beforehand (step 11). The substrate recognition is performed in advance by the camera 36 during the operations of the steps 1 to 7. During step 10, the next flip chip P is subjected to the operations of the steps 6 and 7. The transferring head 31 mounts the flip chips P one after another on the substrate 20 by repeating the operations of the steps 9 to 11.

FIG. 5 shows the head 70 which has picked up the flip chip P and moved to the substrate 20 to hand it over to the transferring head 31. Under this condition, all three heads 70 have been in positions displaced from the point right below the camera 68. Hence, the X table 4 and the Y table 5 are driven to move the flip chip P on the wafer 2, which is to be picked up next, to right under the camera 68 which checks it for a defect. If the camera 68 finds the flip chip P to be defective, then another flip chip P on the wafer 2 is moved to right under the camera 68 and the same inspection is conducted.

When the type or size of the flip chip P to be mounted is changed, the head 70 equipped with the nozzle 73 suited for the new flip chip P is stopped at the pickup station A. For this purpose, the head is selected by controlling the drive of the motor 57. The nozzle 32 of the transferring head 31 is changed.

The chip mounting apparatus may be operated in various ways. For example, in FIG. 1, only the wafer 2 or the trays 8 may be disposed at the pickup station A and only a single type of chips provided on the wafer 2 or the trays 8 may be mounted on the substrate 20. Alternatively, a wafer 2 and two trays 8 respectively equipped with different types of chips may be disposed at the pickup station A. Thus, desired chips may be efficiently and easily mounted on many different types of substrates 20 by providing the head assembly 50 with a plurality of heads 70 and by providing the chip supply portion with a plurality of different types of chips.

According to the present invention, there are provided a plurality of heads which are adapted to be rotated vertically while it is rotated horizontally at the same time, thus making it possible to invert and mount the chips from the chip supply portion onto substrates quickly and easily. Furthermore, according to the invention, many different types of chips may be mounted on a substrate at the same time. The chip mounting apparatus and method in accordance with the invention are especially advantageous for mounting flip chips on substrates.

What is claimed is:

1. A chip mounting apparatus comprising:

a chip supply portion for supplying chips;

a substrate positioning section for positioning a substrate;

a head assembly provided with a plurality of nozzles which pick up the chips from said chip supply portion and perform a horizontal rotation and a vertical rotation so as to invert the chips vertically; and a transferring head which picks up the chips, which have been vertically inverted by said vertical rotation, from said nozzles, and mounts the chips on the substrate.

2. A chip mounting apparatus according to claim 1, further comprising a camera for observing a next chip, which is to be picked up next, from above said next chip to capture an image of said next chip so as to recognize a position of said next chip, under a condition wherein one nozzle of said plurality of nozzles has been horizontally rotated to a position where said one nozzle hands one of said chips over to said transferring head and a next nozzle of said plurality of nozzles is in a position where said next nozzle has been displaced from a position for picking up said next chip in said chip supply portion.

3. A chip mounting apparatus according to claim 1, wherein:

said chips supplied by said chip supply portion comprise a plurality of types of chips having different dimensions; and said plurality of nozzles comprise a plurality of types of nozzles adapted for said plurality of types of chips having said different dimensions, so that said plurality of types of chips may be mounted on said substrate.

4. A chip mounting apparatus according to claim 1, further comprising a nozzle magazine provided with a plurality of types of additional nozzles for exchange with said plurality of nozzles of said head assembly.

5. A chip mounting method comprising:

(a) using a nozzle of a head assembly to pick up a chip from a chip supply portion by vacuum suction;

(b) rotating said nozzle horizontally and vertically to move said chip, which has been picked up in step (a), to a position where said chip is handed over to a transferring head and also to invert said chip vertically; and (c) taking said chip from said nozzle with said transferring head and mounting said chip on a substrate which has been positioned in a positioning section.

6. A chip mounting method according to claim 5, wherein step (a) comprises detecting a position of said chip with a camera.

7. A chip mounting method according to claim 5, wherein:

said chip is selected from among a plurality of types of chips having different dimensions; and said head assembly includes a plurality of types of nozzles adapted for said plurality of types of chips; and step (a) comprises selecting said nozzle from among said plurality of types of nozzles such that said nozzle is adapted for said chip.

8. A chip mounting method according to claim 5, further comprising providing a nozzle magazine having a plurality of types of additional nozzles for exchange with said nozzle.

* * * * *